United States Patent
Wang et al.

(10) Patent No.: US 10,555,444 B2
(45) Date of Patent: Feb. 4, 2020

(54) EMI SHIELDING DEVICE FOR AN OPTICAL TRANSCEIVER AND METHODS OF MANUFACTURING THE SAME

(71) Applicant: Source Photonics (Chengdu) Company, Ltd., Chengdu (CN)

(72) Inventors: Jinlin Wang, Chengdu (CN); Yizhi Zeng, Chengdu (CN)

(73) Assignee: Source Photonics (Chengdu) Co., Ltd., Chengdu (CN)

( * ) Notice: Subject to any disclaimer, the term of this patent is extended or adjusted under 35 U.S.C. 154(b) by 271 days.

(21) Appl. No.: 15/532,313

(22) PCT Filed: May 31, 2017

(86) PCT No.: PCT/CN2017/086625
§ 371 (c)(1),
(2) Date: Jun. 1, 2017

(87) PCT Pub. No.: WO2018/218513
PCT Pub. Date: Dec. 6, 2018

(65) Prior Publication Data
US 2019/0098804 A1 Mar. 28, 2019

(51) Int. Cl.
*H05K 9/00* (2006.01)
*H04B 10/40* (2013.01)

(52) U.S. Cl.
CPC .......... *H05K 9/0058* (2013.01); *H04B 10/40* (2013.01); *H05K 9/0015* (2013.01)

(58) Field of Classification Search
USPC ....................................... 361/816, 818, 799
See application file for complete search history.

(56) References Cited

U.S. PATENT DOCUMENTS

| | | | |
|---|---|---|---|
| 7,559,800 B2 * | 7/2009 | Wu | H01R 13/6584 439/607.3 |
| 7,566,246 B2 | 7/2009 | Moore et al. | |

(Continued)

FOREIGN PATENT DOCUMENTS

| CN | 202183503 U | 4/2012 |
|---|---|---|
| CN | 101669056 A | 3/2016 |

(Continued)

OTHER PUBLICATIONS

Zhang Shaoyou et al.; "Electromagnetic Interference Shielding Device for Optical Transceiver"; Bibliographic Data of CN105723266 (A); Jun. 29, 2016; http://worldwide.espacenet.com.

(Continued)

*Primary Examiner* — Hung S. Bui
(74) *Attorney, Agent, or Firm* — Andrew D. Fortney; Central California IP Group, P.C.

(57) ABSTRACT

Embodiments of the disclosure pertain to an electromagnetic interference shielding device comprising a base plate, first and second lateral plates connected and oriented orthogonally to the base plate, and at least one top plate connected to and oriented orthogonally to the first and second lateral plates, and a method of manufacturing such an electromagnetic interference shielding device. The top plate(s) further include (i) first and second front or side bends extending toward the base plate from a first side of the top plate(s) and (ii) first and second rear bends extending toward the base plate from a second side of the top plates. The second side of the top plate(s) is different from the first side.

19 Claims, 9 Drawing Sheets

(56) References Cited

U.S. PATENT DOCUMENTS

| | | | |
|---|---|---|---|
| 7,955,003 B2 | 6/2011 | Teo et al. | |
| 8,597,045 B2* | 12/2013 | Zhu | H01R 13/506 |
| | | | 439/357 |
| 8,668,515 B2* | 3/2014 | Wu | H01R 13/633 |
| | | | 439/352 |
| 9,832,916 B2 | 11/2017 | Zhang et al. | |
| 2010/0142898 A1 | 6/2010 | Teo et al. | |
| 2012/0252256 A1 | 10/2012 | Zhu et al. | |
| 2012/0288240 A1 | 11/2012 | Kondo et al. | |
| 2015/0256260 A1 | 9/2015 | Kurashima | |
| 2017/0142870 A1 | 5/2017 | Zhang et al. | |
| 2019/0011655 A1* | 1/2019 | Hino | G02B 6/4261 |

FOREIGN PATENT DOCUMENTS

| | | |
|---|---|---|
| CN | 105723266 A | 6/2016 |
| WO | 2009149401 A2 | 12/2009 |

OTHER PUBLICATIONS

Jianjun Zhu et al.; "Connector and Fastener Pad of Same"; Bibliographic Data of CN202183503 (A); Apr. 4, 2012; http://worldwide.espacenet.com.

Joshua Moore et al.; "Collar Clip for an Electronic Module"; Bibliographic Data of CN101669056(A); Mar. 10, 2010; http://worldwide.espacenet.com.

Teo Tat Ming (SG) et al.; "Bail Release Mechanism for Communications Module"; Bibliographic Data of WO2009149401 (A2); Dec. 10, 2009; http://worldwide.espacenet.com.

International Search Report and Written Opinion; PCT International Searching Authortity/CN dated Mar. 8, 2018; International Application No. PCT/CN2017/086625; 10 pages; International Searching Authority/China, State Intellectual Property Office of the People's Republic of China; Beijing, China.

* cited by examiner

EMI SHIELDING DEVICE FOR AN OPTICAL TRANSCEIVER AND METHODS OF MANUFACTURING THE SAME

FIELD OF THE INVENTION

The present invention relates to the field of electromagnetic interference (EMI) shielding devices, and particularly EMI shielding devices for optical or optoelectronic transceivers.

DISCUSSION OF THE BACKGROUND

Optical or optoelectronic transceivers (which may be generally identified as "optical transceivers") convert electrical signals into optical signals and optical signals into electrical signals. An optical transceiver may include receiver and transmitter optical subassemblies, functional circuits, and electrical and optical interfaces, and are a significant component of an optical fiber communication system.

Optical or optoelectronic transceivers are usually assembled by securing or mounting components on one or more substrates and placing the components in a housing that may comprise two matching parts (e.g., an upper part or cap that matches with a lower part or floor of the housing). Since electromagnetic interference (EMI) may pass through the plastic housing and any space surrounding the plastic housing, an electromagnetic interference (EMI) shielding device may be conveniently included in or around the housing. The EMI shielding device reduces EMI between components inside the transceiver and structures outside the transceiver.

If the EMI shielding device is not adequately secured to the plastic housing, an undesirable amount of EMI may pass through the plastic housing and the surrounding space. Furthermore, the EMI shielding device should not protrude too far from the transceiver housing. Otherwise, the EMI shielding device may damage a cage or socket into which it is inserted or from which it is removed, or become damaged itself when it is inserted into or removed from the cage or socket.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY OF THE INVENTION

The present invention relates to an EMI shielding device and a method of manufacturing such a device. The EMI shielding device advantageously shields an optical or optoelectronic transceiver (e.g., an optical transceiver) and the cage or socket into which the optical or optoelectronic transceiver fits from excess electromagnetic radiation. The optical transceiver includes an optical or optoelectronic receiver and an optical or optoelectronic transmitter.

The EMI shielding device may comprise a metal clip or plate. The EMI shielding device includes (i) front or side bends and (ii) rear bends configured to secure the EMI shielding device to the optical transceiver. The corners of the EMI shielding device generally include tears or openings that prevent or reduce the likelihood of the EMI shielding device catching on the cage or socket when sliding the optical transceiver into or out of the cage or socket. Additionally, the front or side bends, the rear bends and the tears or openings may prevent the EMI shielding device from scratching the cage or socket.

The EMI shielding device may further include metal prongs or fingers that secure a foam gasket (e.g., a ring or pad [which may be electrically conductive] around the optical transceiver) to the optical transceiver. The foam gasket is configured to seal the gap, joint or interface between the cage/socket and the optical transceiver, and optionally further block electromagnetic radiation from passing through the gap, joint or interface. The foam gasket may also provide a mechanical buffer that absorbs some or all of the force from vibrations (e.g., through the cage or socket) or sudden movements of the optical transceiver in the cage or socket.

In one aspect, the present invention relates to an electromagnetic interference (EMI) shielding device comprising a base plate, first and second lateral plates connected and oriented orthogonally to the base plate, and at least one top plate connected to and oriented orthogonally to the first and second lateral plates. The top plate(s) include (i) first and second front or side bends extending toward the base plate from a first side of the top plate(s) and (ii) first and second rear bends extending toward the base plate from a second side of the top plate(s). The second side of the top plate(s) is different from the first side of the top plate(s). In various embodiments, the EMI shielding device comprises a metal or a metal alloy.

In some embodiments, the top plate(s) comprises first and second coplanar top plates with a space between them. The first front or side bend and the first rear bend extend from the first top plate, and the second front or side bend and the second rear bend extend from the second top plate.

Each top plate may have a length, an internal width, and an external width. In some embodiments, the internal width is less than the external width. Furthermore, each of the first and second front or side bends may have a length, and a sum of the internal width (of the top plate) and the length of the front or side bends may be less than or equal to the external width (of the top plate). In some embodiments, a width of each of the first and second rear bends is less than the external width (of the top plate), and a length of each of the first and second rear bends is less or equal to than the length of the top plate(s). In other or further embodiments, the sum of (1) the length of the top plate(s) along the first side and (2) a width of each of the first and second front or side bends is less than or equal to the length of the top plate(s) along the second side.

The base plate may include a third edge and a fourth edge, the first lateral plate may include a fifth edge and a sixth edge, the second lateral plate may include a seventh edge and an eighth edge, and the top plate(s) may include a ninth edge and a tenth edge. The third edge and the fifth edge may form a first interface, the fourth edge and the seventh edge may form a second interface, the sixth edge and the ninth edge may form a third interface, and the eighth edge and the tenth edge may form a fourth interface. In some embodiments, the EMI shielding device comprises a first tear or opening at the third interface and a second tear or opening at the fourth interface. The first and second tears may be triangular, conical, curved (e.g., semi-circular), rectangular, or a combination thereof.

In further embodiments, the EMI shielding device comprises a plurality of metal prongs or fingers extending from the first side of each top plate and the same side of each of the base plate and the first and second lateral plates. The metal prongs or fingers are configured to secure a ring or pad (which may be conductive and/or which may comprise a foam) to an optical or optoelectronic transceiver housing.

In some embodiments, the EMI shielding device comprises a plurality of holes in the base plate configured to align the EMI shielding device with the optical transceiver. In other or further embodiments, the EMI shielding device comprises an error-proofing feature extending from a side of the base plate opposite from the first side (e.g., the same side as the first side, or the side opposite from the prongs or fingers), configured to differentiate the EMI shielding device from other EMI shielding devices and optionally align the EMI shielding device with the optical or optoelectronic transceiver housing.

The invention also relates to an optical transceiver, comprising any of the various embodiments of the aforementioned EMI shielding device, a housing around which the EMI shielding device is placed, a receiver in the housing, and a transmitter in the housing. The housing comprises a first depression configured to accommodate the first front or side bend, a second depression configured to accommodate the second front or side bend, a third depression configured to accommodate the first rear bend, and a fourth depression configured to accommodate the second rear bend.

In another aspect, the present invention relates to a method of manufacturing an electromagnetic interference (EMI) shielding device (e.g., the aforementioned EMI shielding device), comprising forming a blank comprising a base plate, first and second lateral plates connected to the base plate, and at least one top plate connected to the first and second lateral plates, forming (i) first and second front or side bends extending from a first side of the top plate(s) and (ii) first and second rear bends extending from a second side of the top plate(s) different from the first side, bending the first and second lateral plates orthogonally to the base plate, and bending the top plate(s) orthogonally to the first and second lateral plates. The first and second front or side bends and the first and second rear bends extend towards the base plate.

In further embodiments, the method of manufacturing an EMI shielding device further comprises forming a plurality of metal prongs extending from the first side of each top plate and the same side of each of the base plate and the first and second lateral plates. The metal prongs or fingers may be configured to secure the above-described ring or pad to an optical or optoelectronic transceiver housing.

In other or further embodiments, the method of manufacturing an EMI shielding device may comprise forming (1) a first tear or opening at a first interface between one top plate and the first lateral plate and (2) a second tear or opening at a second interface between the same or a different top plate and the second lateral plate.

In some embodiments, the method of manufacturing an EMI shielding device comprises forming a plurality of holes in the base plate. The holes in the base plate may be configured to align the EMI shielding device with corresponding bumps, pillars, or projections on the optical or optoelectronic transceiver.

In other or further embodiments, the method of manufacturing an EMI shielding device comprises forming an error-proofing feature extending from a side of the base plate. The error-proofing feature may be configured to differentiate the EMI shielding device from other EMI shielding devices, and optionally align the EMI shielding device with the optical or optoelectronic transceiver housing.

These and other features and advantages of the present invention will become readily apparent from the detailed description of various embodiments below.

DETAILED DESCRIPTION

Reference will now be made in detail to various embodiments of the invention, examples of which are illustrated in the accompanying drawings. While the invention will be described in conjunction with the following embodiments, it will be understood that the descriptions are not intended to limit the invention to these embodiments. On the contrary, the invention is intended to cover alternatives, modifications and equivalents that may be included within the spirit and scope of the invention. Furthermore, in the following detailed description, numerous specific details are set forth in order to provide a thorough understanding of the present invention. However, it will be readily apparent to one skilled in the art that the present invention may be practiced without these specific details. In other instances, well-known methods, procedures and components have not been described in detail so as not to unnecessarily obscure aspects of the present invention. Furthermore, it should be understood that the possible permutations and combinations described herein are not meant to limit the invention. Specifically, variations that are not inconsistent may be mixed and matched as desired.

For the sake of convenience and simplicity, the terms "transceiver," "optical transceiver" and "optoelectronic transceiver" may be used interchangeably, as may the terms "optical" and "optoelectronic," the terms "connected to," "coupled with," "coupled to," and "in communication with" (which include both direct and indirect connections, couplings and communications), the terms "mounting," "affixing," "attaching" and "securing" (and grammatical variations thereof), and the terms "data," "information" and "bit(s)," but these terms are generally given their art-recognized meanings.

The term "length" generally refers to the largest dimension of a given 3-dimensional structure or feature. The term "width" generally refers to the second largest dimension of a given 3-dimensional structure or feature. The term "thickness" generally refers to a smallest dimension of a given 3-dimensional structure or feature. The length and the width, or the width and the thickness, may be the same in some cases. A "major surface" refers to a surface defined by the two largest dimensions of a given structure or feature, which in the case of a structure or feature having a circular surface, may be defined by the radius of the circle.

The invention, in its various aspects, will be explained in greater detail below with regard to exemplary embodiments.

A First Exemplary EMI Shielding Device

Figure 1A:
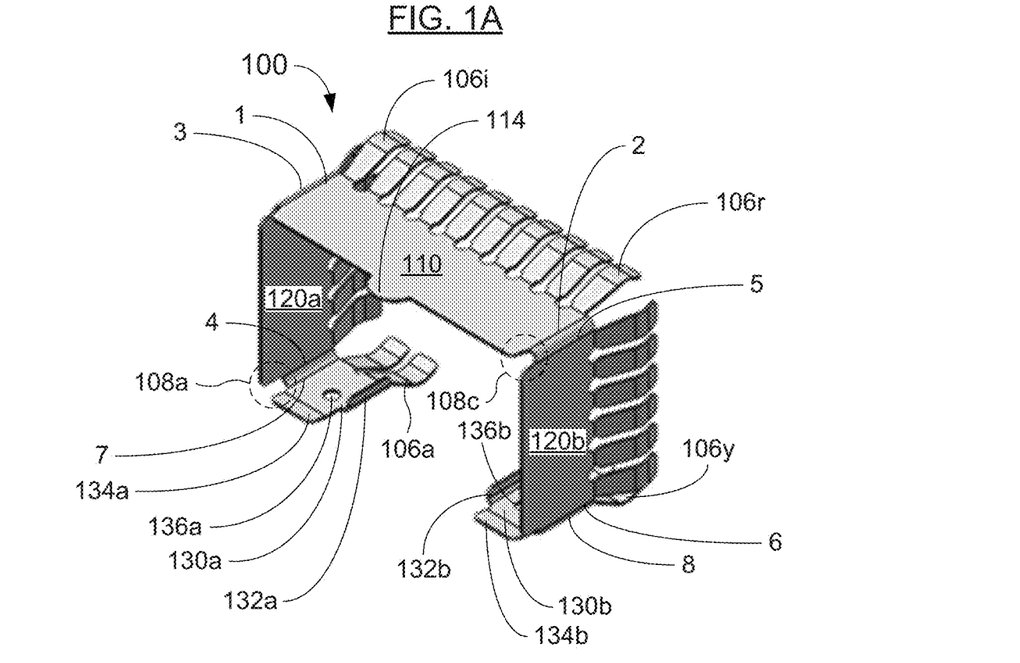
FIG. 1A shows a perspective view of an exemplary EMI shielding device in accordance with one or more embodiments of the present invention.
Figure 1B:
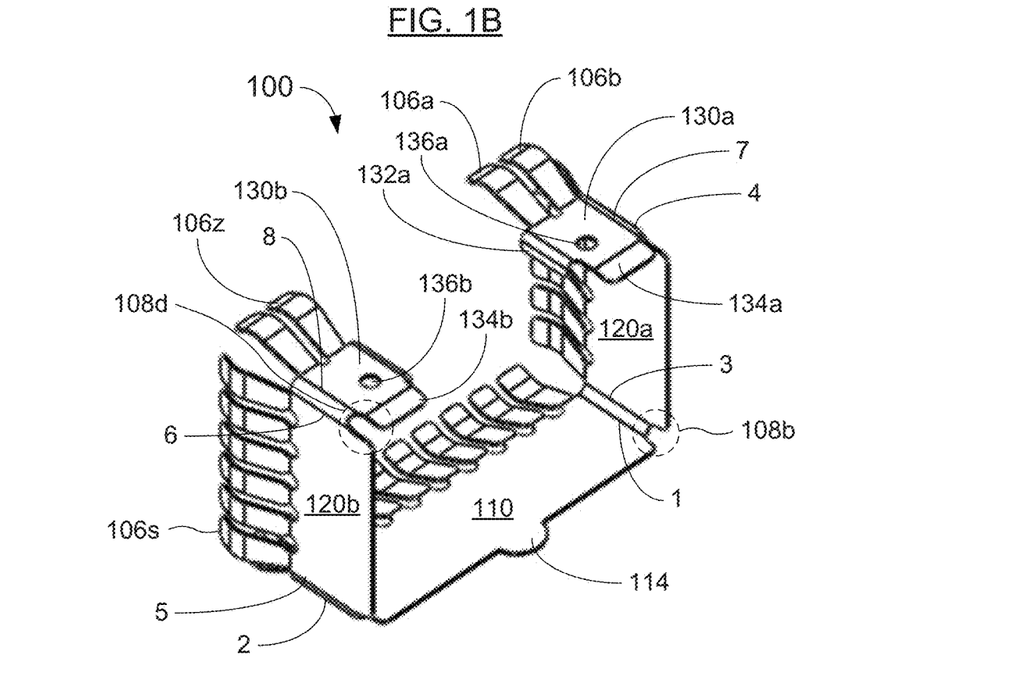
FIG. 1B shows another perspective view of the EMI shielding device of FIG. 1A.

FIGS. 1A-B show an exemplary EMI shielding device 100 including a base plate 110, a first lateral plate 120*a*, a second lateral plate 120*b*, a first top plate 130*a*, a second top plate 130*b*, a plurality of metal prongs 106*a-z*, a plurality of tears or openings 108*a-d*, first and second side bends 132*a-b*, first and second rear bends 134*a-b*, an error-proofing feature 114, and holes 136*a-b*.

The side bends 132*a-b* extend towards the base plate 110 and are configured to secure the EMI shielding device 100 to an optical transceiver. The side bends 132*a-b* may also be configured to prevent the EMI shielding device 100 sliding forward along the optical transceiver housing (e.g., as it is inserted into a cage or socket). In such a case, the optical transceiver housing may have one or more depressions or troughs therein to receive the side bends 132*a-b*. The side bends 132*a-b* may be at an angle of 30°-150° (or any angle or range of angles therein, such as 60°-120°, or about 90°) with respect to the plane of the top plates 130*a-b*. As shown in FIGS. 1A-B, there may be material between the each of the side bends 132*a-b* and the corresponding top plates 130*a-b* (which may be considered part of the side bends 132*a-b*).

The rear bends 134*a-b* also extend toward the base plate 110 and are also configured to secure the EMI shielding device 100 to the optical transceiver. Similar to the side bends 132*a-b*, the rear bends 134*a-b* may prevent the EMI shielding device 100 from sliding backward along the optical transceiver (e.g., when the optical transceiver is removed from the cage or socket). In such a case, the optical transceiver housing may have one or more additional depressions or troughs to receive the rear bends 134*a-b*. Alternatively, a single depression or trough in the optical transceiver housing may receive one or more rear bends and one or more side bends. The rear bends 134*a-b* may be at an angle of 10°-90° (or any angle or range of angles therein, such as 15°-45°, or about 30°) with respect to the plane of the top plates 130*a-b*. The angle of the rear bends 134*a-b* may depend on their width (e.g., the wider the rear bends, the smaller the angle).

The base plate 110 includes a first edge 1 and second edge 2, the first lateral plate 120*a* includes a third edge 3 and a fourth edge 4, the second lateral plate 120*b* includes a fifth edge 5 and a sixth edge 6, the first top plate 130*a* includes a seventh edge 7 and the second top plate 130*b* includes an eighth edge 8. The first edge 1 and the third edge 3 directly or indirectly form a first interface. The second edge 2 and the fifth edge 5 directly or indirectly form a second interface. The fourth edge 4 and the seventh edge 7 directly or indirectly form a third interface. The sixth edge 6 and the eighth edge 8 directly or indirectly form a fourth interface. Two of the edges indirectly form an interface when there is material between them. The edges directly form an interface when there is no material between them.

The plurality of metal prongs or fingers 106*a-z* extend from the same side of the EMI shielding device 100 (e.g., the side opposite the rear bends 134*a-b*) and are configured to fit around the optical transceiver. Optionally, the metal prongs or fingers 106*a-z* secure a foam gasket or ring around the optical transceiver (e.g., one or more features in/on the housing of the optical transceiver). The prongs or fingers 106*a-z* may have a total length of from 50% to 150% of the width of the base, lateral and top plates (or any percentage or range of percentages therein, such as 80-120%). In one example, the length of the prongs or fingers 106*a-z* is about the same as the width of the base, lateral and top plates 110, 120*a-b* and 130*a-b*.

The tears or openings 108*a-d* are configured to prevent the EMI shielding device 100 from getting caught or snagged on a cage or socket into which the transceiver is inserted. In addition, the tears or openings 108*a-d* may allow the EMI shielding device 100 to be placed on the optical transceiver easily and may reduce or minimize a tight fit in the cage or socket. The tears or openings 108*a-d* may be circular, triangular, square, rectangular, rounded, flared or any other shape or combination of shapes that allows facile insertion of the transceiver into the cage or socket, and optionally, facile placement of the EMI shielding device 100 on the optical transceiver. While EMI shielding is generally a function of the area and/or amount of material providing the EMI shielding, the tears or openings 108*a-d* do not adversely affect the EMI shielding properties of the EMI shielding device 100.

The tears or openings 108*a-d* may have a depth of from 5% to 50% of the width of the base, lateral and top plates 110, 120*a-b*, and 130*a-b* (or any percentage or range of percentages therein, such as 10-40%, or in one example, about 25%). In general, the width of the tears or openings 108*a-d* is greatest at the side of the EMI shielding device 100 away from the prongs or fingers 106*a-z* and smallest at the point or points closest to the side of the EMI shielding device 100 from which the prongs or fingers 106*a-z* extend, but the invention is not limited thereto. The width of the tears or openings 108*a-d* may be about the same as or greater than the width of the material between adjacent plate edges (e.g., edges 2 and 5, edges 6 and 8, etc.). In the case where there is no material between adjacent plate edges, the average width of the tears or openings 108*a-d* may be about 50-100% of the length of the tears or openings 108a-d, in either the folded or blank form of the EMI shielding device 100.

The error-proofing feature 114 is configured to differentiate the EMI shielding device 100 from other EMI shielding devices, and optionally, to align the EMI shielding device 100 with the transceiver housing. In further embodiments, the EMI shielding device 100 may include a plurality of error-proofing features substantially similar to error-proofing feature 114. Thus, each model and/or version of optical transceiver may have a unique feature or set of features configured to match or mate with the error-proofing feature 114. By including a different error-proofing feature or set of error-proofing features for each model and/or version of optical transceiver, a correct EMI shielding device will be placed on the corresponding model and/or version of optical transceiver.

The error-proofing feature 114 as shown extends from the base plate 110 on the side opposite from the metal prongs or fingers 106a-z, but may alternatively or additionally be along the first lateral plate 120a and/or the second lateral plate 120b. The error-proofing feature 114 generally cannot extend from the top plates 130a-b due to the presence of the side and rear bends 132a-b and 134a-b and the prongs or fingers 106a-b and 106y-z. The error-proofing feature 114 may be circular, triangular, square, rectangular, or any other shape or combination of shapes that allows facile alignment of the EMI shielding device 100 with the housing. The error-proofing feature 114 may have a width or height of from 5% to 50% (or any percentage or range of percentages therein, such as 10-40%, and in one example, about 20-25%) of the width of the base plate 110 (or, if attached to a lateral plate, the lateral plates 120a-b). In addition, the error-proofing feature 114 may have a length of from 5% to 25% (or any percentage or range of percentages therein, such as 10-20%, and in one example, about 15-17%) of the length of the base plate 110 or from 10% to 40% (or any percentage or range of percentages therein, such as 15-35%, and in one example, about 25%) of the length of the lateral plates 120a-b.

The holes 136a-b are configured to align the EMI shielding device 100 in a predetermined position or location on the transceiver housing. The transceiver housing may therefore have one or more features (e.g., a projection, pillar, bump, etc.) configured to fit into the holes 136a-b to assist the alignment and/or positioning of the EMI shielding device 100 on the transceiver housing. In alternative embodiments, the holes 136a-b may be formed along the first lateral plate 120a, the second lateral plate 120b and/or the base plate 110. The holes 136a-b may be circular, triangular, square, rectangular, or any other shape or combination of shapes that ensures correct alignment and/or placement of the EMI shielding device 100 on the transceiver housing. Each of the holes 136a-b may have a width or diameter of from 5% to 50% of the width of the plates 110, 120a-b and 130a-b (or any percentage or range of percentages therein, such as 10-40%, and in one example, about 25-30%), and may be centered on a center line along the length of the plates 110, 120a-b, and/or 130a-b. Alternatively, the holes 136a-b may be offset from such a center line.

The EMI shielding device 100 may comprise a metal or metal alloy, such as titanium, iron, stainless steel or inconel. The EMI shielding device 100 may be manufactured by stamping or cutting a blank (e.g., a flat piece or sheet of metal/alloy) into a shape of the base plate 110, the lateral plates 120a-b, the top plates 130a-b, the first and second side bends 132a-b, the first and second rear bends 134a-b, the plurality of metal prongs 106a-z, the plurality of tears or openings 108a-d and the error-proofing feature 114, and to form the holes 136a-b with a forming or stamping press, then bending the cut blank to form the EMI shielding device 100 in its 3-dimensional form using the forming press or a machine press. Some or all of the side bends 132a-b and the rear bends 134a-b may be formed (e.g., bent) in the stamping press.

In one example, the side bends 132a-b and the rear bends 134a-b may be made first, then bends between (i) the base plate 110 and the lateral plates 120a-b and (ii) the lateral plates 120a-b and the top plates 130a-b are formed (in any order). In an alternative example, bends between (i) the base plate 110 and the lateral plates 120a-b and (ii) the lateral plates 120a-b and the top plates 130a-b are formed (in any order), then the side bends 132a-b and the rear bends 134a-b may be made. Bends in the prongs or fingers 106a-z may be made before bends between (i) the base plate 110 and the lateral plates 120a-b and (ii) the lateral plates 120a-b and the top plates 130a-b in either of the processes mentioned above.

In an alternative embodiment, the EMI shielding device 100 may comprise a single top plate in place of the top plates 130a-b. In such an embodiment, the top plates 130a-b may be long enough to touch or overlap in the center of the EMI shielding device 100, in which case the touching or overlapping top plates can be crimped, soldered or adhered to form a single plate. Alternatively, the base plate 110 can be formed from two plates folded from the first and second lateral plates 120a-b and secured to each other in the center by crimping, soldering or adhering. The metal/alloy of the blank between the two side bends 132a-b may remain or be removed, as desired.

Figure 1C:
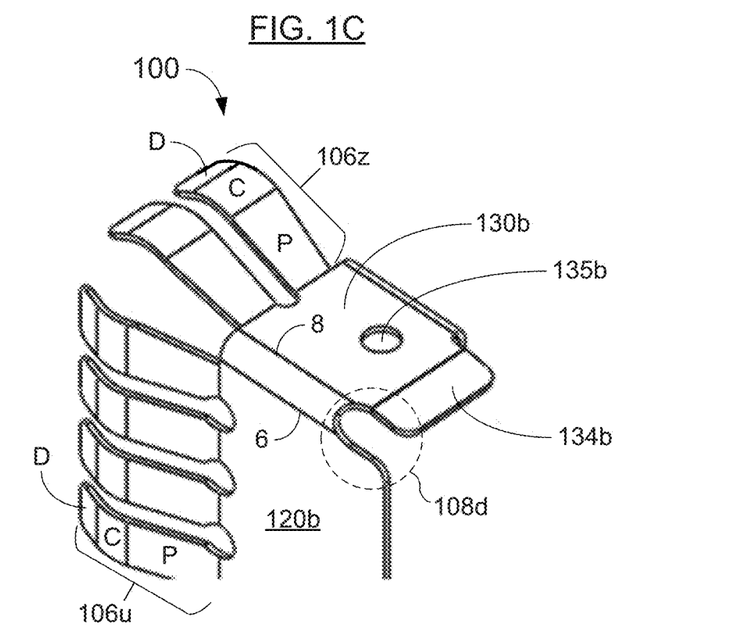
FIG. 1C shows a close-up perspective view of a corner of the upper side of the EMI shielding device of FIGS. 1A-B.

FIG. 1C shows a corner of EMI shielding device 100, including the metal prongs or fingers 106u-z, the tear or opening 108d, the rear bend 134b, part of the lateral plate 120b, the top plate 130b, the hole 136b, and the edges 6 and 8. The side bend 132b is hidden below the top plate 130b. Each of the metal prongs or fingers 106u-z includes a proximal section P that is joined to a corresponding plate, a distal section D furthest from the plate to which it is joined, and a center section C between the proximal and distal sections P and D. The center section C may be planar or curved, and may have multiple subsections or be omitted completely. If the center section C is planar, it may be parallel with the plane of the plate to which the prongs or fingers are joined. The prongs or fingers 106a-t (FIGS. 1A-B are identical or substantially identical to the prongs or fingers 106u-z.

As shown, the tear or opening 108d has a curved shape at the end of the tear or opening 108d closest to the metal prongs or fingers 106u-z (i.e., the end closest to the center of the material between the top plate 130b and the lateral plate 120b), a flared shape at the side of the EMI shielding device 100 opposite from the metal prongs or fingers 106u-z, and a rectangular shape between the curved section and the flared section. Other shapes for the tear or opening 108d are possible, as described herein. In general, all of the tears or openings (e.g., 108a-d in FIGS. 1A-B) have the same shape, but the invention is not limited thereto.

Figure 1D:
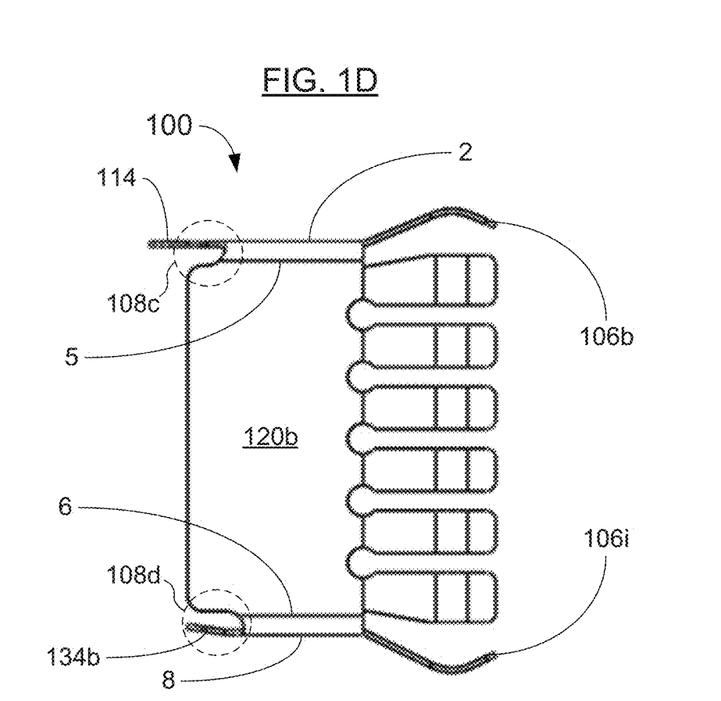
FIG. 1D shows a side view of the EMI shielding device shown in FIGS. 1A-C.

FIG. 1D shows a side view of the EMI shielding device 100 including the metal prongs or fingers 106b-i, the tears or openings 108c-d, the rear bend 134b, the error-proofing feature 114, the lateral plate 120b, and the edges 2, 5, 6, and 8. The error-proofing feature 114 is generally co-planar with the plate to which it is joined (e.g., base plate 110). The proximal and distal sections P and D of each of the metal prongs or fingers 106a-z may be at an angle of ±10°-45° with respect to the plane of the plate to which it is joined, or any angle or range of angles therein (e.g., ±15°-30°.

A Second Exemplary EMI Shielding Device

Figure 2A:
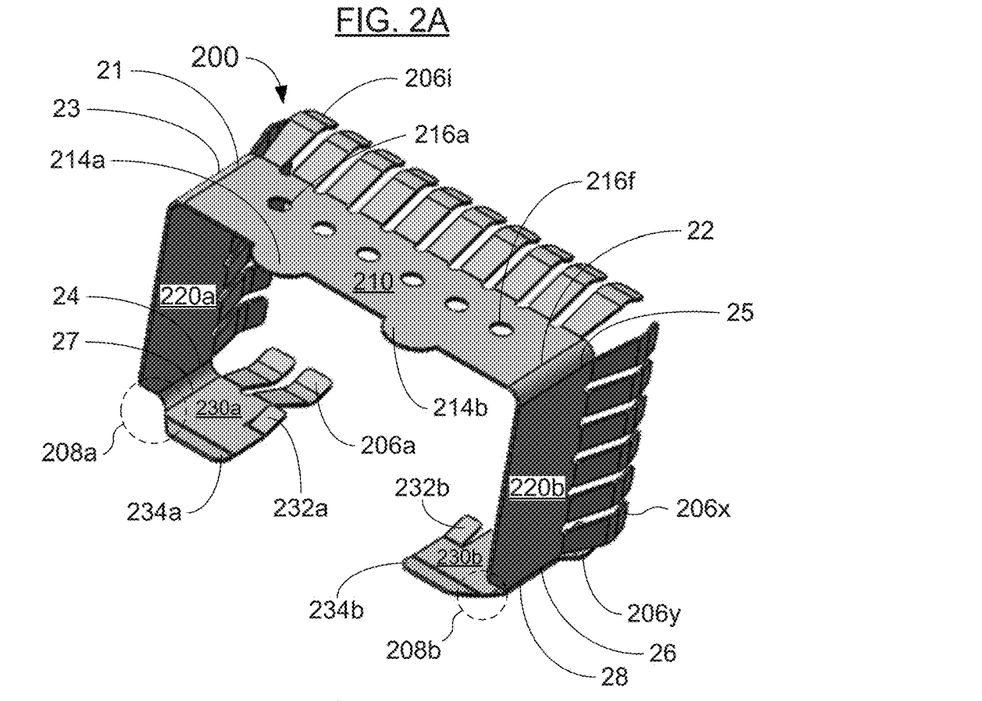
FIG. 2A shows a perspective view of another exemplary EMI shielding device in accordance with one or more embodiments of the present invention.
Figure 2B:
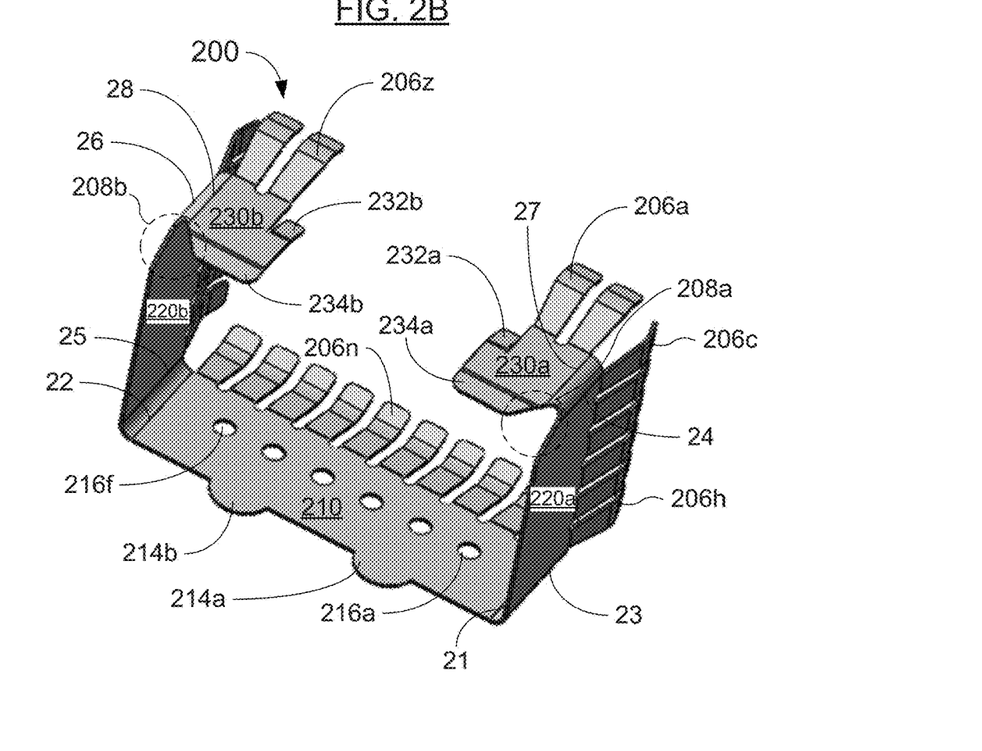
FIG. 2B shows another perspective view of the EMI shielding device of FIG. 2A.

FIGS. 2A-B show an alternative EMI shielding device 200 including a base plate 210, a first lateral plate 220a, a second lateral plate 220b, a first top plate 230a, a second top plate 230b, a plurality of metal prongs or fingers 206a-z, tears or openings 208a-b, first and second front bends 232a-b, first and second rear bends 234a-b, error-proofing features 214a-b, and alignment holes 236a-f. The EMI shielding device 200 of FIGS. 2A-B is similar to the EMI shielding device 100 of FIGS. 1A-D in most, if not all respects.

Similar to the side bends 132a-b in the EMI shielding device 100 of FIGS. 1A-D, the front bends 232a-b extend toward the base plate 210 and are configured to secure the EMI shielding device 200 to an optical transceiver and prevent the EMI shielding device 200 from sliding forward along the optical transceiver housing (e.g., as it is inserted into a cage or socket). The rear bends 234a-b are the same or substantially the same as rear bends 134a-b in the exemplary EMI shielding device 100 of FIGS. 1A-D. The optical transceiver housing may have one or more depressions or troughs to receive the front bends 232a-b and the rear bends 234a-b. The front bends 232a-b may be at an angle of 10°-75° (or any angle or range of angles therein, such as 15°-45° with respect to the plane of the top plates 130a-b.

Similar to the EMI shielding device 100 of FIGS. 1A-D, the base plate 210 includes a first edge 21 and second edge 22, the first lateral plate 220a includes a third edge 23 and a fourth edge 24, the second lateral plate 220b includes a fifth edge 25 and a sixth edge 26, the first top plate 230a includes a seventh edge 27 and the second top plate 230b includes an eighth edge 28. The first edge 21 and the third edge 23 directly or indirectly form a first interface. The second edge 22 and the fifth edge 25 directly or indirectly form a second interface. The fourth edge 24 and the seventh edge 27 directly or indirectly form a third interface. The sixth edge 26 and the eighth edge 28 directly or indirectly form a fourth interface.

The plurality of metal prongs or fingers 206a-z extend from the same side of the EMI shielding device 200 (e.g., the side opposite from the rear bends 234a-b and the error-proofing features 214a-b), are configured to fit around an optical transceiver, and are the same or substantially similar to the metal prongs or fingers 106a-z of FIGS. 1A-D. Optionally, the metal prongs or fingers 206a-z secure a foam gasket or ring around the optical transceiver (as can the metal prongs or fingers 106a-z of the EMI shielding device 100 in FIGS. 1A-D).

Like the tears or openings 108a-d in the EMI shielding device 100 of FIGS. 1A-D, the tears or openings 208a-b are configured to prevent the EMI shielding device 200 from getting caught or snagged on a cage or socket into which the transceiver is inserted, and may be similar to the tears or openings 108a-d of FIGS. 1A-D. In addition, the tears or openings 208a-b may allow the EMI shielding device 200 to be placed on the optical transceiver easily, may reduce or minimize a tight fit in the cage or socket, and may have dimensions similar or identical to those of the tears or openings 108a-d in the EMI shielding device 100 of FIGS. 1A-D. However, unlike the EMI shielding device 100 in FIGS. 1A-D, the EMI shielding device 200 has tears or openings at only two corners. Thus, the present EMI shielding device may have tears or openings at two or more corners (e.g., the corners at the third and fourth interfaces, the corners at the first through fourth interfaces, etc.). As shown, the tears or openings 208a-b are triangular, but they may be circular, square, rectangular, or any other shape or combination of shapes that allows facile insertion of the transceiver into the cage or socket, and optionally, facile placement of the EMI shielding device 200 on the optical transceiver.

The error-proofing features 214a-b are configured to differentiate the EMI shielding device 200 from other EMI shielding devices and/or to align the EMI shielding device 200 with the housing, and may be the same as or similar to the error-proofing feature 114 in the EMI shielding device 100 of FIGS. 1A-D. The EMI shielding device 200 may include more than two or less than two error-proofing features the same as or substantially similar to error-proofing features 214a-b, which may be along the first lateral plate 220a and/or the second lateral plate 220b, in addition to or instead of the base plate 220. The error-proofing features 214a-b may have a circular, triangular, square, rectangular or other shape or combination of shapes. However, since the error-proofing features 214a-b differ in number and/or placement from the error-proofing feature 114 in the EMI shielding device 100 of FIGS. 1A-D, the EMI shielding device 200 is for a different optical transceiver than the EMI shielding device 100 of FIGS. 1A-D.

The alignment holes 216a-f are configured to align the EMI shielding device 200 on the transceiver housing and may be the same as or similar to the holes 136a-b in FIGS. 1A-D. The transceiver housing may have corresponding features (e.g., projections, pillars, bumps, etc.) configured to fit into the holes 216a-f to assist the alignment or placement of the EMI shielding device 200 on the optical transceiver. In a similar or identical manner to the holes 136a-b, the holes 216a-f may be in the first lateral plate 220a, the second lateral plate 220b, the first top plate 230a and/or the second top plate 230b, in addition to or instead of the base plate 210. Thus, while the EMI shielding device 200 has six holes 216a-f in the base plate 210, the present EMI shielding device may include one or more holes in the top plate(s) (e.g., 1 hole), one or more holes in either or both of the lateral plates (e.g., 2-4 holes), and/or two or more holes in the base plate (e.g., 3-8 holes).

The holes 216a-f as shown are circular, but may be triangular, square, rectangular or any other shape or combination of shapes that allows facile alignment and/or placement of the EMI shielding device 200 on the transceiver housing. In addition, the holes 216a-f may be co-linear (as shown) or staggered or offset from each other.

The EMI shielding device 200 may comprise a metal or metal alloy, the same as or similar to the EMI shielding device 100 in FIG. 1, and may be manufactured by a process similar or identical to that used to manufacture the EMI shielding device 100 in FIG. 1. However, a cut or score is made in the top plates 230a-b to separate each top plate 230a-b from the corresponding front bend 232a-b.

Exemplary Optical Transceivers

Figure 3A:
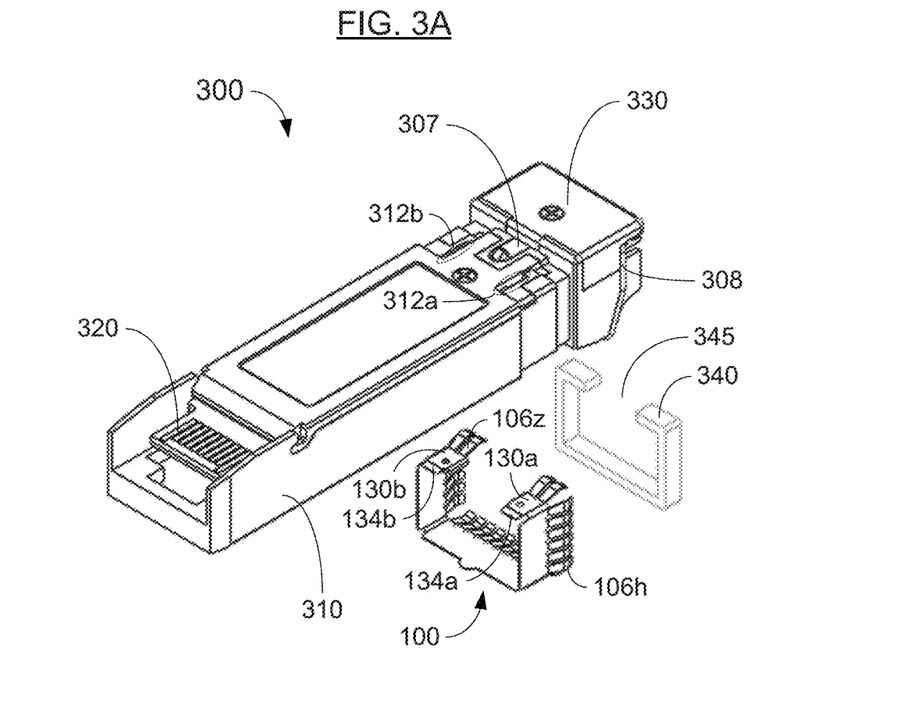
FIG. 3A shows a perspective view of exemplary components for an optical assembly, including an optical transceiver, the EMI shielding device of FIGS. 1A-D, and a foam gasket.

FIG. 3A shows an exemplary optical transceiver 300, a foam gasket or ring 340, and the electromagnetic interference (EMI) shielding device 100 of FIGS. 1A-D, including the top plates 130a-b, the prongs or fingers 106a-z and the side bends 132a-b. The optical transceiver 300 includes a housing 310, an electrical interface 320, an optical interface 330, a latching mechanism 307 and a lever 308. The housing 310 has depressions or troughs 312a-b therein, configured to receive the side bends 132a-b of the EMI shielding device 100. The foam gasket or ring 340 includes an opening 345.

Figure 3B:
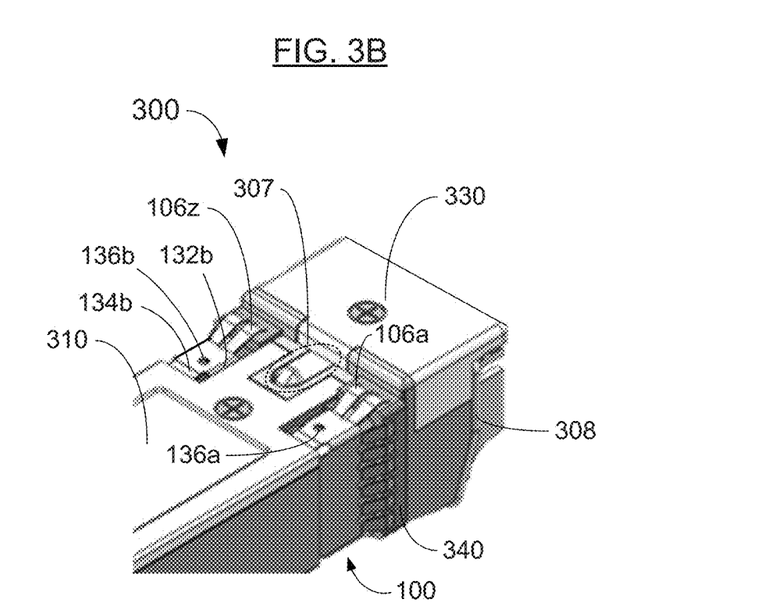
FIG. 3B shows a perspective view of the optical port end of the optical transceiver of FIG. 3A after assembling the components.

The housing 310 of the optical transceiver 300 (including the optical interface 330) may comprise plastic and/or another dielectric or insulating material. The EMI shielding device 100 fits around the optical transceiver 300 and secures the foam gasket or ring 340 to the housing 310, as shown in FIG. 3B. For example, the foam gasket 340 may be placed around the optical transceiver 300 by inserting the optical transceiver 300 sideways into the opening 345, and then rotating the gasket 340 into place (e.g., with the opening 345 exposing the latching mechanism 307). The EMI shielding device 100 may then be placed on the optical transceiver 300 in a similar manner to the gasket 340, such that the top plates 130a-b are on opposite sides of the latching mechanism 307, and the metal prongs or fingers 106a-z are on the gasket 340. The alignment holes 136a-b ensure that the EMI shielding device 100 is in the predetermined position on the optical transceiver 300 (e.g., adjacent or proximate to the optical interface 330 and/or alongside the latching mechanism 307, and at an entrance or opening to a cage or socket into which the optical transceiver is inserted). The opening 345 in the gasket 340 is substantially aligned with the gap between the top plates 130a-b of the EMI shielding device 100.

The EMI shielding device 100 may be pliable enough to expand the space between the top plates 130a-b (to an extent necessary) and allow the optical transceiver 300 to rotate in the EMI shielding device 100. The metal prongs 106a-z secure the gasket 340 to the optical transceiver 300. The depressions 312a-b in the housing 310 receive the corresponding side bends 132a-b, which stop the EMI shielding device 100 from sliding forward into the optical interface 330. The housing 310 may include additional depressions, or a recessed or relatively thin region (e.g., a "neck") between the main body of the housing 310 and the optical interface 330 to receive the rear bends 134a-b, which stop the EMI shielding device 100 from sliding backward into the main body of the housing 310.

The optical transceiver 300 may be an SFP (Small Form-Factor Pluggable) transceiver, an XFP (10 Gigabit Small Form-Factor Pluggable) transceiver, an SFP+ (Enhanced Small Form-Factor Pluggable) transceiver, or any other standardized optoelectronic transceiver type. The optical transceiver 300 includes the electrical interface 320 at a first end, the optical interface 330 at a second end, and one or more processing devices in each of a transmitter electrical path and a receiver electrical path (not shown) in the transceiver between the electrical interface 320 and the optical interface 330. The electrical interface 320 may be on a printed circuit board (PCB). The electrical interface 320 is configured to be coupled to a host or storage device, and the optical interface 330 is configured to receive one or two optical fibers in communication with one or more other transceivers. The optical interface 330 may include one or more standardized jacks or sockets for receiving the optical fiber(s).

The foam gasket or ring 340 seals the gap between the optical transceiver 300 and the EMI shielding device 100 and may further prevent EMI between the optical transceiver 300 and electrically active structures or devices outside the optical transceiver 300 and the cage or socket in which the optical transceiver 300 is placed. The foam gasket or ring 340 may comprise a polymer and optionally a conductive material (e.g., a non-conductive polymer foam such as a silicone foam with metal particles suspended therein, a polymer foam on a metal film [or vice versa], a conductive polymer foam, etc.).

The latching mechanism 307 secures the optical transceiver 300 to the cage or socket by engaging (e.g., being inserted into) a depression or hole in the socket or cage. The latching mechanism 307 is operably connected to the lever 308. The lever 308 may comprise plastic or metal. Lifting or pulling on the lever 308 releases the optical transceiver 300 from the cage or socket by disengaging the latching mechanism 307.

Figure 3C:
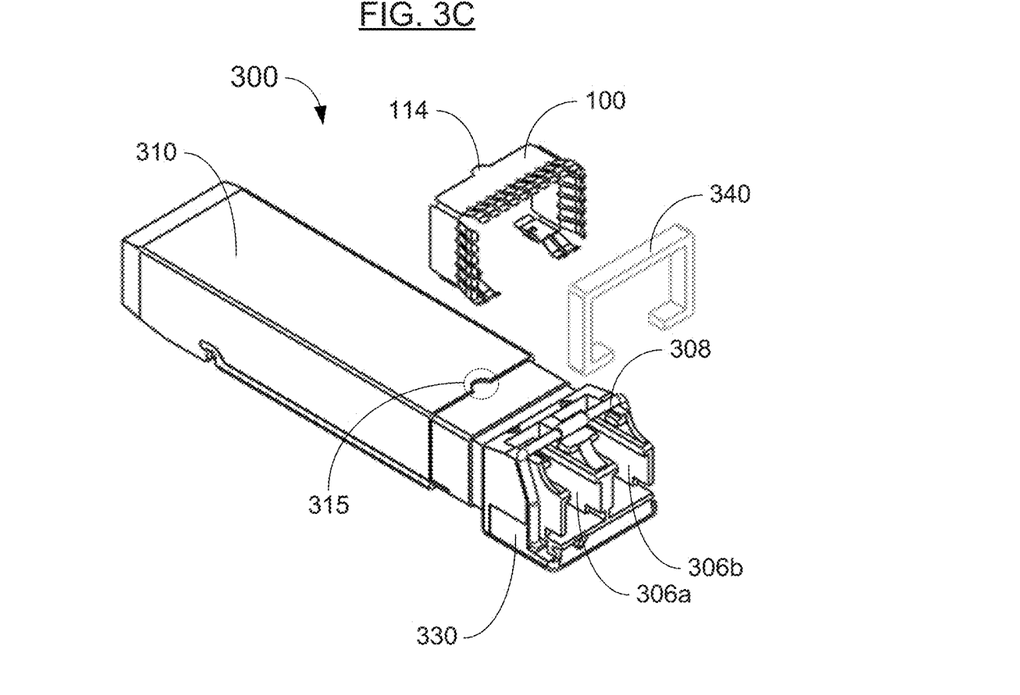
FIG. 3C shows the components of FIG. 3A in a different perspective view.

FIG. 3C shows an opposite perspective view of the optical transceiver 300, the EMI shielding device 100, and the foam gasket or ring 340. The housing 310 of the optical transceiver 300 includes a feature (e.g., a notch or cut-out) 315 configured to match, mate with, or complement the error-proofing feature 114. The error-proofing feature 114 ensures that the correct EMI shielding device is placed on the optical transceiver 300.

The optical interface 330 includes a first port 306a and second port 306b. The first port 306a receives and secures a first optical fiber. A transmitter optical subassembly (TOSA) in the optical transceiver 300 (e.g., adjacent to the first port 306a) includes a laser diode (LD). The second port 306b receives and secures a second optical fiber. A receiver optical subassembly (ROSA) in the optical transceiver 300 (e.g., adjacent to the second port 306b) includes a photodiode (PD). The transmitter electrical path is connected between the electrical interface 320 and the LD. The receiver electrical path is connected between the electrical interface 320 and the PD. The transmitter electrical path typically includes a laser driver, the TOSA may include a monitoring photodiode configured to sample a signal strength or optical power of the optical signal emitted by the LD, and the receiver electrical path may include a transimpedence amplifier (TIA) and a limiting amplifier. Components in both the receiver electrical path and the transmitter electrical path are typically connected to a microcontroller configured to control operations of the components. An analog-to-digital converter (ADC) may be electrically connected between the monitoring PD and the microcontroller.

The laser diode (e.g., the transmitter) converts an electrical signal (e.g., from a host device connected to the electrical interface 320 [FIG. 3A]) to an optical signal. The optical signal is then transmitted through the first optical fiber to another transceiver in the network. The photodiode (e.g., in the receiver) converts an optical signal from the second optical fiber to an electrical signal. The electrical signal is then transmitted to an external device (e.g., the host) through the electrical interface 320.

Figure 3D:
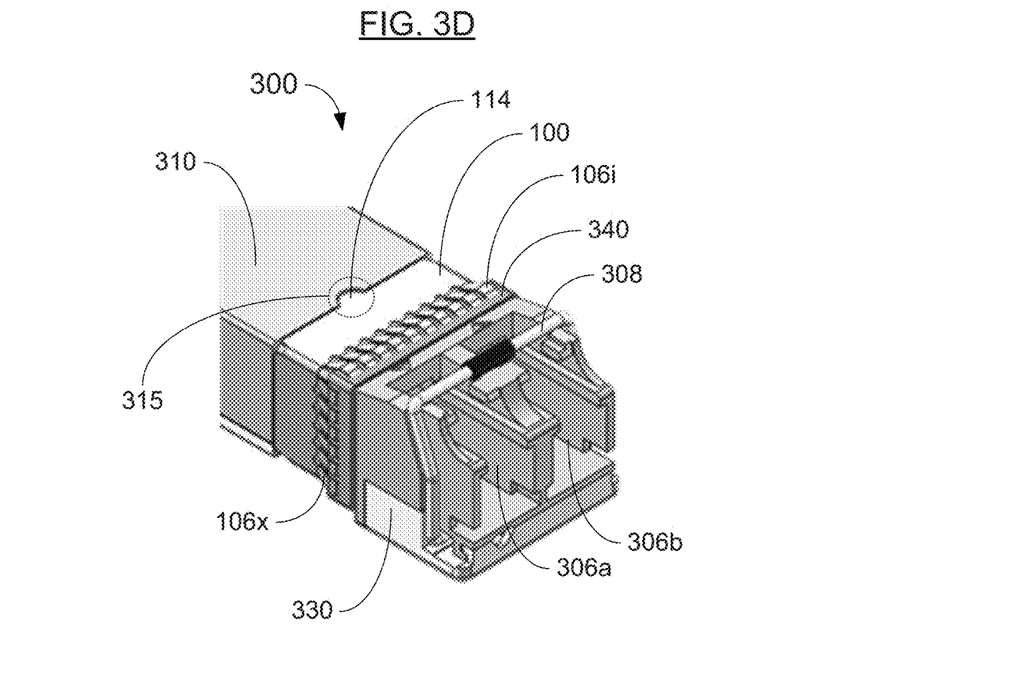
FIG. 3D shows an underside of the optical port end of the optical transceiver of FIGS. 3A-C after assembling the components.

FIG. 3D is a close-up view of the optical interface 330 of the optical transceiver 300 of FIG. 3C with the EMI shielding device 100 and the foam gasket or ring 340 in place (e.g., around the "neck" of the optical transceiver 300). As shown, the error-proofing feature 114 fits in the notch or cut-out 315 in the optical transceiver housing 310, and the metal prongs or fingers 106i-x grasp or secure the foam gasket 340.

Figure 4:
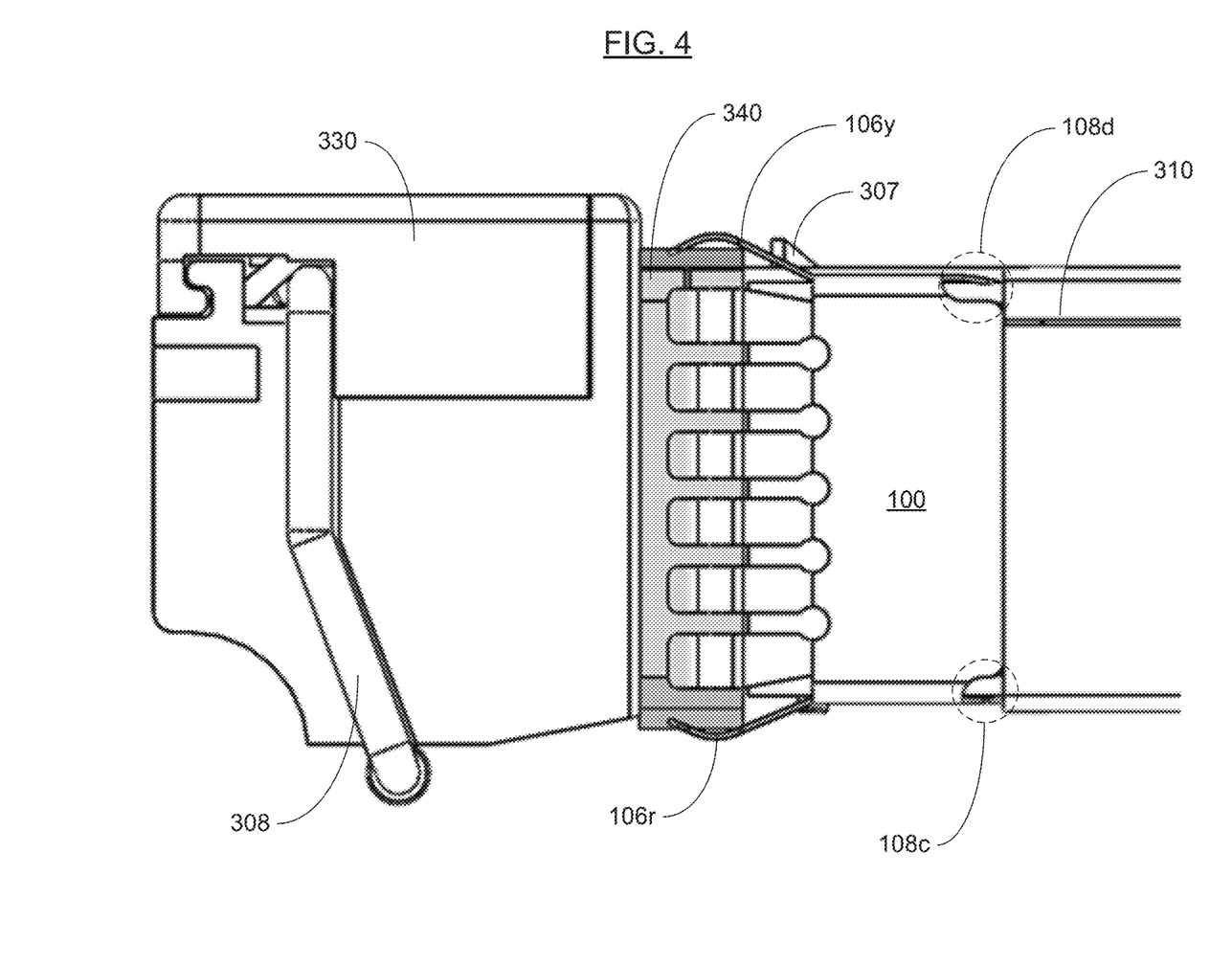
FIG. 4 is a side view of the optical port end of the optical assembly shown in FIGS. 3A-D.

FIG. 4 shows a side view of the end of the optical transceiver 300 including the optical interface 330 with the EMI shielding device 100 and the foam gasket or ring 340 thereon. The metal prongs or fingers 106r-y secure the foam gasket 340 in place. The tears or openings 108c-d provide relief at the corners of the optical transceiver housing 310 to enable the assembled optical transceiver 300, the EMI shielding device 100 and the foam gasket 340 to slide easily into and out of a cage or socket.

Figure 5:
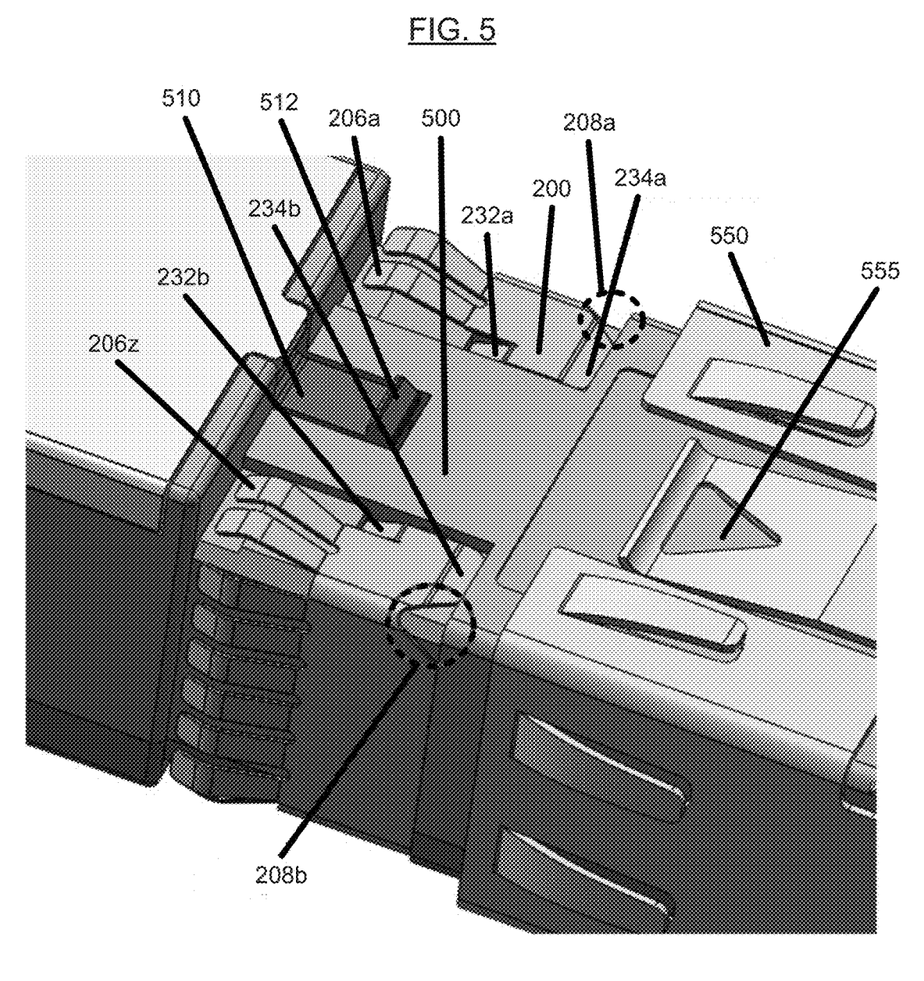
FIG. 5 shows part of an exemplary optical assembly including the EMI shielding device shown in FIGS. 2A-B, an optical transceiver and part of a cage or socket in accordance with one or more embodiments of the present invention.

FIG. 5 shows an exemplary optical transceiver 500 with the EMI shielding device 200 of FIG. 2 thereon inserted into a cage 500. The EMI shielding device 200 includes the metal prongs 206a-z, the tears 208a-b, the front bends 232a-b, and the rear bends 234a-b. The optical transceiver 500 may be substantially similar to the optical transceiver 300 described with respect to FIGS. 3A-D and 4. The housing of the optical transceiver 500 may have depressions configured to fit the front bends 232a-b and the rear bends 234a-b (see, e.g., FIG. 7). A latching mechanism 510-512, which may be substantially similar to the latching mechanism 307 described in FIGS. 3A-B, secures the optical transceiver 500 to the cage 550 by engaging a projection 512 with an opening 555 in a clip-like feature in the cage 550. A lever 510 may disengage the projection 512 from the cage 550 by lowering the projection 512 when a handle (e.g., the handle of the lever 308 in FIGS. 3A-D) is raised, rotated or pulled. Thus, the cage 550 covers the EMI shielding device 200 when the optical transceiver 500 is completely inserted into the cage 550. The metal prongs or fingers 206a-z secure the EMI shielding device 200 to the housing of the optical transceiver 500. The tears or openings 208a-b ensure facile entry and removal of the optical transmitter 500 into and from the cage 550, without adversely affecting the EMI shielding properties of the EMI shielding device 200.

Figure 6:
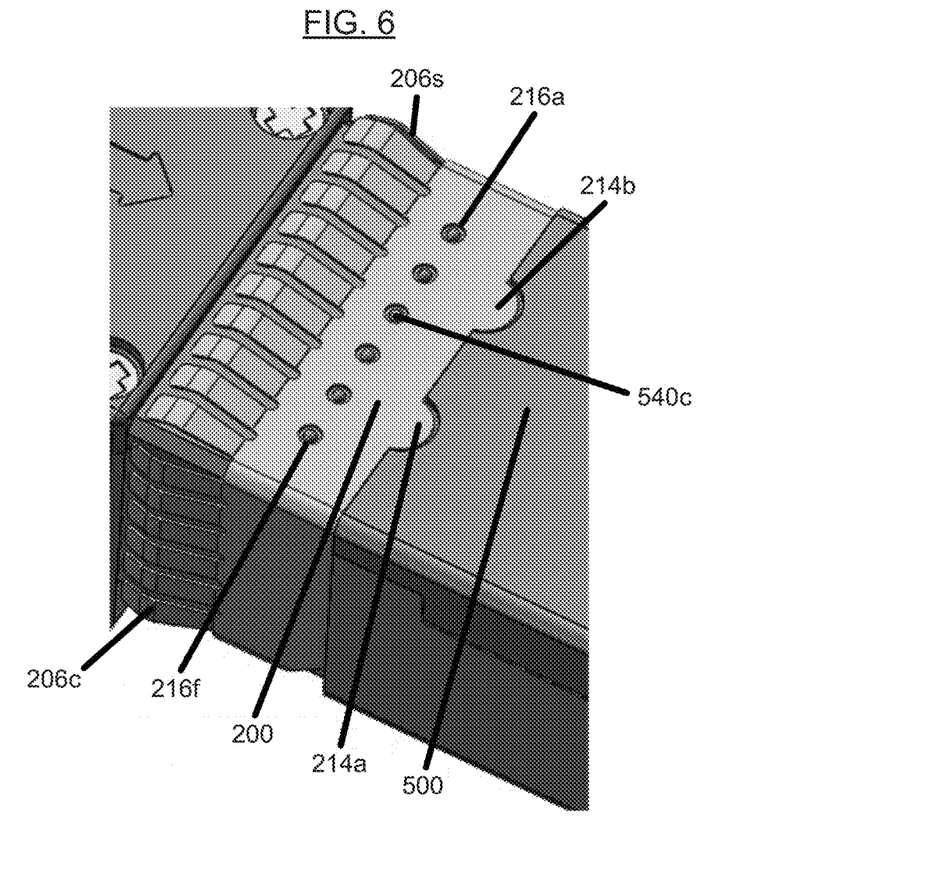
FIG. 6 shows an underside of the exemplary optical assembly shown in FIG. 5, without the cage or socket.

FIG. 6 shows an opposite side of the assembled EMI shielding device 200 and the optical transceiver 500 shown in FIG. 5. The metal prongs 206c-s secure the EMI shielding device 200 to the housing of the optical transceiver 500. In a further embodiment, a foam gasket or ring (which may be conductive) may be between the prongs or fingers 206c-s and the housing of the optical transceiver 500. The error-proofing features 214a-b are configured to differentiate the EMI shielding device 200 from other EMI shielding devices and optionally to align the EMI shielding device 200 with the housing of the optical transceiver 500. The alignment holes 216a-f allow for facile alignment and/or positioning of the EMI shielding device 200 on projections 540a-f extending from the housing of the optical transceiver 500.

Figure 7:
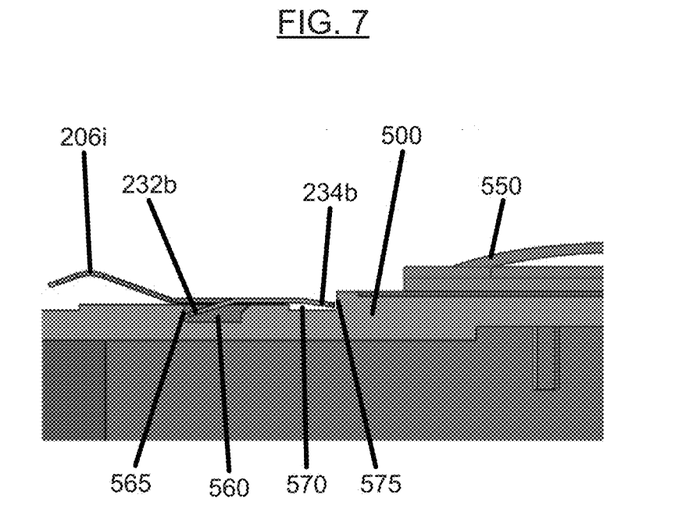
FIG. 7 shows a cross-sectional view of the top plate of the exemplary EMI device of FIGS. 2A-B in place on the optical transceiver shown in FIGS. 5-6.

FIG. 7 shows a side view of a cross-section of the upper section of the assembled EMI shielding device 200 and optical transceiver 500 shown in FIG. 5, partially inserted into the cage 550. A depression 560 in the housing of the optical transceiver 500 receives the front bend 232b and stops the EMI shielding device 200 from sliding forward (e.g., by contacting a sidewall 565 of the depression 560) when the optical transceiver 500 is inserted into the cage 550. Another depression 570 receives the rear bend 234b and stops the EMI shielding device 200 from sliding backward (e.g., by contacting a sidewall 575 of the depression 570) when the optical transceiver 500 is removed from the cage 550.

Exemplary Top Plate Designs

Figure 8:
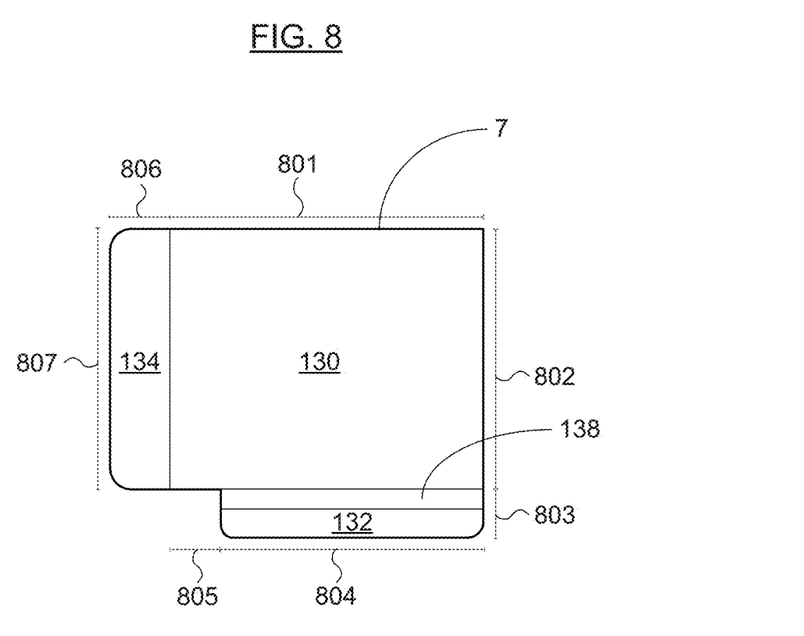
FIG. 8 shows a part of an exemplary blank corresponding to the top plate of the EMI shielding device shown in FIGS. 1A-D, including a side bend portion and a rear bend portion in accordance with embodiments of the present invention.

FIG. 8 shows a top-down, plan view of a top plate 130, a side bend 132, a rear bend 134, and an edge 7 similar or identical to those in the EMI shielding device 100 of FIGS. 1A-D. The top plate 130 has an external width 801 at the edge 7 that interfaces with a corresponding lateral plate, a length 802 (e.g., along a side from which one or more prongs or fingers extend), an internal width at an interface with a corresponding side plate 134 (or the material 138 between the top plate 130 and the side bend 132, which may be considered part of the side bend 132), and a distance 805 between the side bend 132 and the rear bend 134. The side bend 132 has a width 803 and a length 804. The rear bend 134 has a width 806 and a length 807.

The length 804 of the side bend 132 is less than or equal to the external width 801 of the top plate 130. For example, the length 804 of the side bend 132 may be 50-100% of the external width 801 of the top plate 130. The sum of the distance 805 of the top plate 130 and the length 804 is equal to the external width 801 of the top plate 130. The width 806 of the rear bend 134 is less than the external width 801 (e.g., by at least 50%). For example, the width 806 of the rear bend 134 may be 10-35% of the external width 801. The length 807 of the rear bend 132 is less than or equal to the length 802 of the top plate 130. For example, the length 807 of the rear bend 132 may be 80-10% of the length 802 of the top plate 130. The width 803 of the side bend 132 is less than the length 802 of the top plate 130 (e.g., by at least 75%). For example, the width 803 of the side bend 132 may be 10-25% of the length 802 of the top plate 130.

Figure 9:
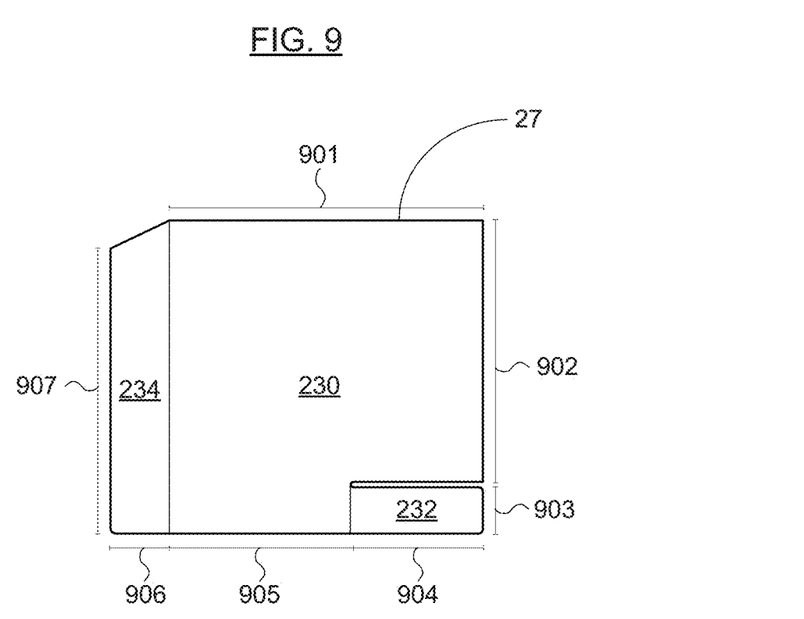
FIG. 9 shows a part of an exemplary blank corresponding to the top plate of the EMI shielding device shown in FIGS. 2A-B, including a front bend portion and a rear bend portion in accordance with embodiments of the present invention.

FIG. 9 shows a top-down, plan view of a top plate 230, a front bend 232, a rear bend 234, and an edge 27 similar or identical to those in the EMI shielding device 200 of FIGS. 2A-B. The top plate 230 has an external width 901 at the edge 27 that interfaces with a corresponding lateral plate, a front length 902 (e.g., along a side from which one or more prongs or fingers extend), and internal width 905 between the front bend 232 and the rear bend 234. The front bend 232 has a width 903 and a length 904. The front bend 232 has a width 903 and a length 904. The rear bend 234 has a width 906 and a length 907.

The length 904 of the front bend 232 is less than or equal to the width 901 of the top plate 230. For example, the length 904 of the front bend 232 may be 25-50% of the width 901 of the top plate 230. A sum of the internal width 905 of the top plate 230 and the length 904 of the front bend 232 is equal to or less than the external width 901 of the top plate 230. The width 906 of the rear bend 234 is less than the external width 901 of the top plate 230 (e.g., by at least 50%) and less than or equal to the internal width 905 of the top plate 230. For example, the width 906 of the rear bend 234 may be 10-50% of the external width 901 of the top plate 230 and 15-75% of the internal width 905 of the top plate 230. The internal width 905 of the top plate 230 is less than the external width 901 and less than or equal to the length 902 of the top plate 230. For example, the internal width 905 of the top plate 230 may be 50-75% of the external width 901 and 60-100% of the length 902 of the top plate 230. The length 907 of the rear bend 232 is less than or equal to the sum of the length 902 of the top plate 230 and the width 903 of the front plate 232. For example, the length 907 of the rear bend 232 may be 80-100% of the sum of the length 902 of the top plate 230 and the width 903 of the front plate 232. The width 903 of the side bend 232 is less than the length 902 of the top plate 230. For example, the width 903 of the side bend 232 may be 10-40% of the length 902 of the top plate 230.

CONCLUSION/SUMMARY

The foregoing descriptions of specific embodiments of the present invention have been presented for purposes of illustration and description. They are not intended to be exhaustive or to limit the invention to the precise forms disclosed, and obviously many modifications and variations are possible in light of the above teachings. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An optical transceiver, comprising:
an electromagnetic interference (EMI) shielding device comprising:
a base plate;
a plurality of holes in the base plate configured to align the EMI shielding device with the optical transceiver;
first and second lateral plates connected and oriented orthogonally to the base plate;
at least one top plate connected to and oriented orthogonally to the first and second lateral plates; and
an error-proofing feature configured to differentiate the EMI shielding device from other EMI shielding devices, wherein:
each top plate, the base plate, and the first and second lateral plates have a first side on a same side of the EMI shielding device that includes a plurality of metal prongs extending therefrom,
the at least one top plate includes (i) first and second front or side bends extending toward the base plate from the at least one top plate and (ii) first and second rear bends extending toward the base plate from a second side of the at least one top plate opposite from the first side of the at least one top plate, and
the error-proofing feature extends from a second side of the base plate opposite from the first side of the base plate;
a housing around which the EMI shielding device is placed, wherein:
the housing comprises a first depression configured to accommodate the first front or side bend, a second depression configured to accommodate the second front or side bend, a third depression configured to accommodate the first rear bend, and a fourth depression configured to accommodate the second rear bend,
the housing includes a notch or cut-out configured to match, mate with, or complement the error-proofing feature, and
the error-proofing feature is configured to align the EMI shielding device with the housing;
a receiver in the housing; and
a transmitter in the housing.

2. The optical transceiver of claim 1, wherein the at least one top plate comprises first and second coplanar top plates with a space between the first and second coplanar top plates, the first front or side bend and the first rear bend extend from the first top plate, and the second front or side bend and the second rear bend extend from the second top plate.

3. The optical transceiver of claim 1, wherein each of the at least one top plate has a length, an internal width, and an external width, wherein the internal width is less than the external width.

4. The optical transceiver of claim 3, wherein each of the first and second front or side bends has a length, and a sum of the internal width and the length of the front or side bends is less than or equal to the external width.

5. The optical transceiver of claim 3, wherein a width of each of the first and second rear bends is less than the external width, and a length of each of the first and second rear bends is less or equal to than the length of the at least one top plate.

6. The optical transceiver of claim 3, wherein a sum of the length of the at least one top plate along the first side and a width of each of the first and second front or side bends is less than or equal to the length of the at least one top plate along the second side.

7. The optical transceiver of claim 1, wherein the base plate includes a first edge and a second edge, the first lateral plate includes a third edge and a fourth edge, the second lateral plate includes a fifth edge and an sixth edge, and the at least one top plate includes a seventh edge and an eighth edge, wherein the first edge and the third edge form a first interface, the second edge and the fifth edge form a second interface, the fourth edge and the seventh edge form a third interface, and the sixth edge and the eighth edge form a fourth interface.

8. The optical transceiver of claim 7, comprising a first tear at the third interface and a second tear at the fourth interface.

9. The optical transceiver of claim 8, wherein the first and second tears are triangular.

10. The optical transceiver of claim 1, wherein the metal prongs are configured to secure a conductive ring or pad to an optical receiver and/or transmitter housing.

11. The optical transceiver of claim 1, wherein the EMI shielding device comprises a metal or a metal alloy.

12. The optical transceiver of claim 1, wherein the error-proofing feature has a length and a width or height, the base plate has a width and a length, the width or height of the error-proofing feature is from 5% to 50% of the width of the base plate, and the length of the error-proofing feature is from 5% to 25% of the length of the base plate.

13. The optical transceiver of claim 1, further comprising at least one additional error-proofing feature substantially similar to the error-proofing feature.

14. The optical transceiver of claim 1, wherein the error-proofing feature is co-planar with the base plate.

15. The optical transceiver of claim 1, wherein the error-proofing feature has a shape selected from circular, triangular, square, rectangular and combinations thereof.

16. A plurality of the optical transceivers of claim 1, the optical transceivers comprising a plurality of different models and/or versions, wherein each model and/or version of the optical transceivers has a unique feature or set of features configured to match or mate with the error-proofing feature.

17. A method of manufacturing an optical transceiver, comprising:
forming a blank comprising a base plate, first and second lateral plates connected to the base plate, and at least one top plate connected to the first and second lateral plates;
forming a plurality of holes in the base plate configured to align the EMI shielding device with the optical transceiver;
forming (i) first and second front or side bends extending from a first side of the at least one top plate and (ii) first and second rear bends extending from a second side of the at least one top plate different from the first side;
forming an error-proofing feature extending from a side of the base plate, configured to differentiate the EMI shielding device from other EMI shielding devices and optionally align the EMI shielding device with an optical transceiver housing;
bending the first and second lateral plates orthogonally to the base plate;
bending the at least one top plate orthogonally to the first and second lateral plates;

forming a housing, the housing comprising a first depression configured to accommodate the first front or side bend, a second depression configured to accommodate the second front or side bend, a third depression configured to accommodate the first rear bend, a fourth depression configured to accommodate the second rear bend, and a notch or cut-out configured to match, mate with, or complement the error-proofing feature, wherein the error-proofing feature is configured to align the EMI shielding device with the housing; and placing a receiver and a transmitter in the housing, wherein the first and second front or side bends and the first and second rear bends extend towards the base plate.

18. The method of claim 17, further comprising forming a plurality of metal prongs extending from extending from the first side of each top plate and a same side of each of the base plate and the first and second lateral plates.

19. The method of claim 17, further comprising forming a first tear at a first interface between one of the at least one top plate and the first lateral plate and a second tear at a second interface between a same or different one of the at least one top plate and the second lateral plate.

* * * * *